(12) United States Patent
Endo et al.

(10) Patent No.: US 11,525,871 B2
(45) Date of Patent: Dec. 13, 2022

(54) MAGNETIC SENSOR AND MAGNETIC SENSOR MANUFACTURING METHOD

(71) Applicant: SHOWA DENKO K. K., Tokyo (JP)

(72) Inventors: Daizo Endo, Ichihara (JP); Tatsunori Shino, Ichihara (JP); Haruhisa Ohashi, Ichihara (JP)

(73) Assignee: SHOWA DENKO K. K., Tokyo (JP)

( * ) Notice: Subject to any disclaimer, the term of this patent is extended or adjusted under 35 U.S.C. 154(b) by 0 days.

(21) Appl. No.: 17/290,813

(22) PCT Filed: Sep. 5, 2019

(86) PCT No.: PCT/JP2019/035034
§ 371 (c)(1),
(2) Date: May 3, 2021

(87) PCT Pub. No.: WO2020/110407
PCT Pub. Date: Jun. 4, 2020

(65) Prior Publication Data
US 2021/0373093 A1 Dec. 2, 2021

(30) Foreign Application Priority Data
Nov. 29, 2018 (JP) .............................. JP2018-223623

(51) Int. Cl.
G01R 33/06 (2006.01)
(52) U.S. Cl.
CPC .................................. *G01R 33/063* (2013.01)
(58) Field of Classification Search
CPC ...... G01R 33/063; G01R 33/06; G01R 33/00; G01R 33/0011; G01R 33/02; G01R 33/09;
(Continued)

(56) References Cited

U.S. PATENT DOCUMENTS

| 7,265,948 B2* | 9/2007 | Hoshiya .................. H01L 43/10 |
| 2009/0066326 A1 | 3/2009 | Itoi et al. |
| 2010/0109663 A1 | 5/2010 | Itoi et al. |

FOREIGN PATENT DOCUMENTS

| DE | 10308640 A1 * | 9/2004 | ............. B82Y 25/00 |
| JP | 2002-92828 A | 3/2002 | |

(Continued)

OTHER PUBLICATIONS

International search report for PCT/JP2019/035034 dated Oct. 8, 2019.

(Continued)

*Primary Examiner* — Son T Le
(74) *Attorney, Agent, or Firm* — Sughrue Mion, PLLC

(57) ABSTRACT

A magnetic sensor 1 includes: a nonmagnetic substrate 10; a sensitive element 31 laminated on the substrate 10, the sensitive element 31 being made of a soft magnetic material, the sensitive element 31 having a longitudinal direction and a transverse direction and having uniaxial magnetic anisotropy in a direction intersecting the longitudinal direction, the sensitive element 31 being configured to sense a magnetic field by a magnetic impedance effect; and a pair of thin-film magnets 20a, 20b laminated on the substrate 10 and disposed to face each other in the longitudinal direction across the sensitive element 31, the pair of thin-film magnets 20a, 20b being configured to apply a magnetic field in the longitudinal direction of the sensitive element 31.

7 Claims, 6 Drawing Sheets

(58) Field of Classification Search
CPC .... G01R 33/091; G01R 33/093; G01D 5/245; H01L 43/00; G01P 3/488
See application file for complete search history.

(56) References Cited

FOREIGN PATENT DOCUMENTS

| | | | |
|---|---|---|---|
| JP | 2002-176210 A | | 6/2002 |
| JP | 2007-26514 A | | 2/2007 |
| JP | 2008-249406 A | | 10/2008 |
| JP | 2008249406 A | * | 10/2008 |
| JP | 2015-010902 A | | 1/2015 |
| JP | 2017-053655 A | | 3/2017 |
| WO | 2007/129705 A1 | | 11/2007 |

OTHER PUBLICATIONS

Notice of Reasons for Refusal dated Oct. 4, 2022 from the Japanese Patent Office in counterpart Japanese Application No. 2018-223623.

* cited by examiner

MAGNETIC SENSOR AND MAGNETIC SENSOR MANUFACTURING METHOD

TECHNICAL FIELD

The present invention relates to a magnetic sensor and a magnetic sensor manufacturing method.

BACKGROUND ART

Some publications in this field disclose a magnetic impedance effect element including: a thin-film magnet composed of a hard magnetic film formed on a nonmagnetic substrate; an insulating layer covering the thin-film magnet; and a magneto-sensitive part composed of one or more rectangular soft magnetic films formed on the insulating layer and imparted with uniaxial anisotropy (see Patent Document 1).

CITATION LIST

Patent Literature

Patent Document 1: Japanese Patent Application Laid-Open Publication No. 2008-249406

SUMMARY OF INVENTION

Technical Problem

A magnetic sensor may include an insulating layer interposed between a sensitive element that senses a magnetic field by a magnetic impedance effect and a thin-film magnet that applies a bias magnetic field to the sensitive element. When high-frequency electric current is supplied to the sensitive element of such a magnetic sensor, the magnetic sensor may act as a capacitor with capacitance due to polarization of the insulating layer. In this case, the high-frequency electric current supplied to the sensitive element is used for the capacitor, which may reduce the amount of impedance change as a function of the amount of magnetic field change.

An object of the present invention is to provide a magnetic sensor that exhibits a large amount of impedance change as a function of the amount of magnetic field change as compared to cases where an insulating layer is interposed between the sensitive element and the thin-film magnet.

Solution to Problem

An aspect of the present invention is a magnetic sensor including: a nonmagnetic substrate; a sensitive element laminated on the substrate, the sensitive element being made of a soft magnetic material, the sensitive element having a longitudinal direction and a transverse direction and having uniaxial magnetic anisotropy in a direction intersecting the longitudinal direction, the sensitive element being configured to sense a magnetic field by a magnetic impedance effect; and a pair of thin-film magnets laminated on the substrate and disposed to face each other in the longitudinal direction across the sensitive element, the pair of thin-film magnets being configured to apply a magnetic field in the longitudinal direction of the sensitive element.

The above magnetic sensor may further include a pair of yokes laminated on the substrate, each of the pair of yokes being disposed between the sensitive element and a corresponding one of the pair of thin-film magnets, the pair of yokes being configured to induce magnetic flux generated by the pair of thin-film magnets such that the magnetic flux passes through the sensitive element in the longitudinal direction.

In the above magnetic sensor, each of the pair of yokes may be in contact with a magnetic pole of the corresponding one of the pair of thin-film magnets, the magnetic pole facing the sensitive element in the longitudinal direction thereof.

In the above magnetic sensor, each of the pair of yokes may be disposed continuously over an area from a position between the sensitive element and the corresponding one of the pair of thin-film magnets to a top side of the corresponding one of the pair of thin-film magnets.

In the above magnetic sensor, the sensitive element may be composed of a plurality of soft magnetic layers antiferromagnetically coupled to each other across a demagnetizing field suppressing layer composed of Ru or an Ru alloy.

Another aspect of the present invention is a method for manufacturing a magnetic sensor, the method including: forming, on a nonmagnetic substrate, a pair of thin-film magnets whose magnetic anisotropy is controlled in an in-plane direction thereof, the pair of thin-film magnets being disposed such that different magnetic poles face each other with a space in between; and forming a sensitive part including a sensitive element on the substrate, the sensitive element having uniaxial magnetic anisotropy in a direction intersecting a direction in which magnetic flux generated by the pair of thin-film magnets passes, the sensitive element being configured to sense a magnetic field by a magnetic impedance effect.

Advantageous Effects of Invention

The present invention provides a magnetic sensor that exhibits a large amount of impedance change as a function of the amount of magnetic field change as compared to cases where an insulating layer is interposed between the sensitive element and the thin-film magnet.

DESCRIPTION OF EMBODIMENTS

A magnetic sensor as discussed herein is one that uses a so-called magnetic impedance effect element.

Below a detailed description will be given of an exemplary embodiment of the present invention with reference to the attached drawings.

First Embodiment (Structure of the Magnetic Sensor 1)

Figure 1A:
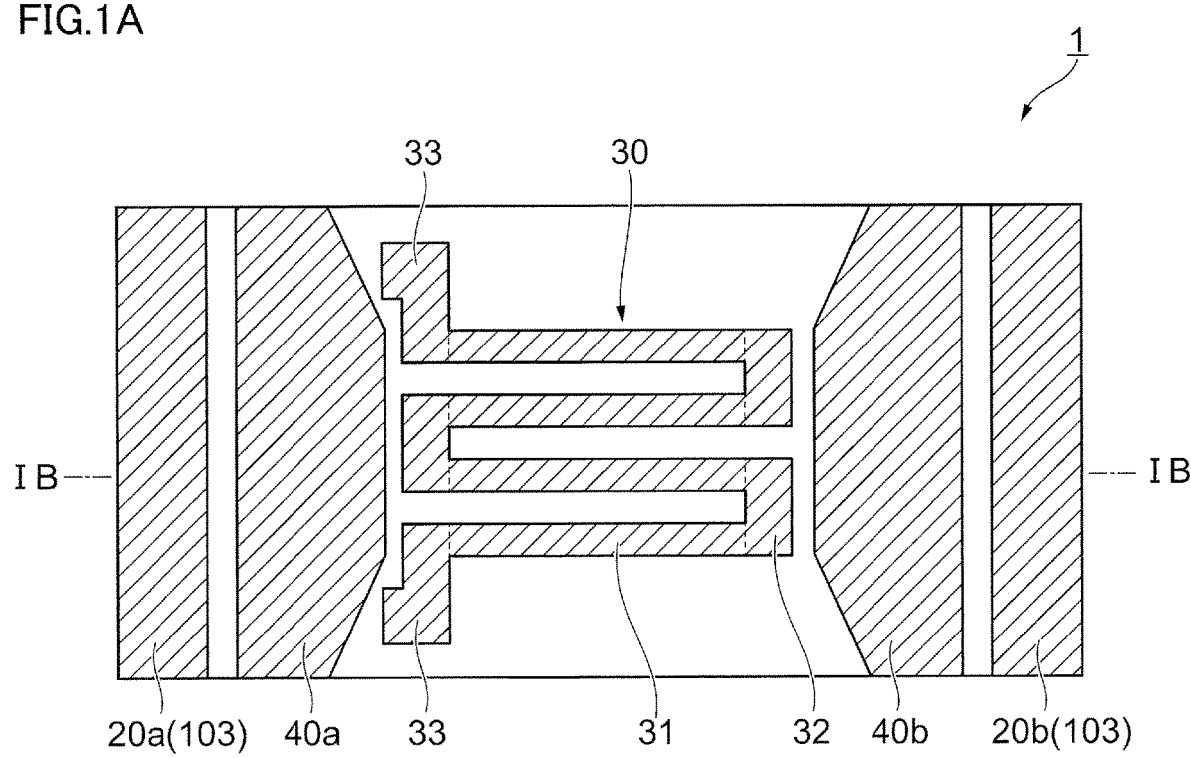
FIGS. 1A and 1B illustrate an example of a magnetic sensor in accordance with an exemplary embodiment.
Figure 1B:
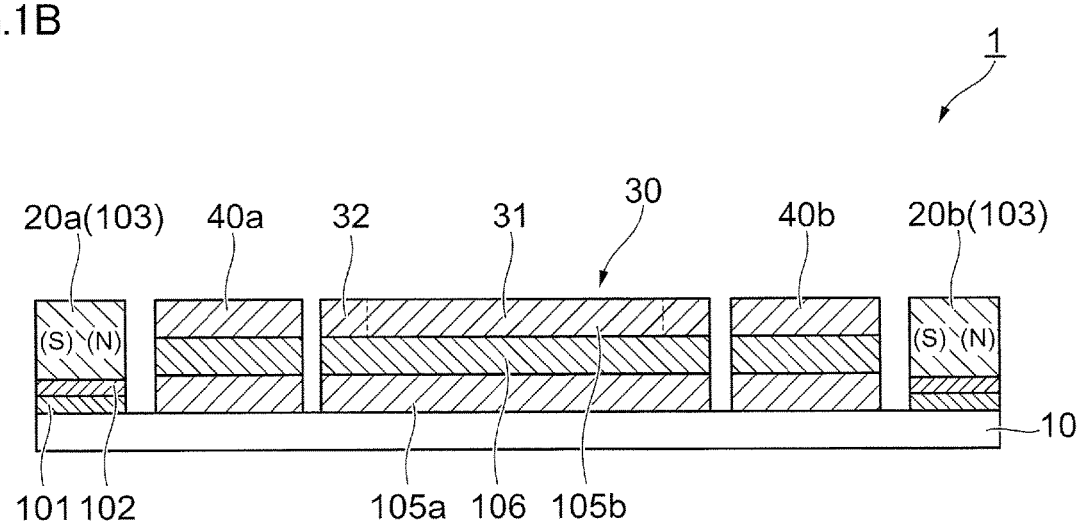

FIGS. 1A and 1B illustrate an example of the magnetic sensor 1 in accordance with an exemplary embodiment; FIG. 1A is a plan view of the magnetic sensor 1, and FIG. 1B is a sectional view taken along a line IB-IB in FIG. 1A.

As shown in FIGS. 1A and 1B, the magnetic sensor 1 in accordance with the present embodiment includes a non-magnetic substrate 10 and a sensitive part 30 disposed on the substrate 10. The sensitive part 30 senses a magnetic field and is composed of two layers of a soft magnetic material (lower soft magnetic layer 105a and upper soft magnetic layer 105b) with a demagnetizing field suppressing layer 106 interposed in between. The magnetic sensor 1 further includes yokes 40 disposed on the substrate 10. The yokes 40 are each composed of the two layers of the soft magnetic material (soft magnetic layers 105a, 105b) with the demagnetizing field suppressing layer 106 interposed in between and face sensitive elements 31 (described later) of the sensitive part 30 in a longitudinal direction thereof. In the following description, the two layers of the soft magnetic material (lower soft magnetic layer 105a and upper soft magnetic layer 105b) are simply referred to as soft magnetic layers 105 unless their distinction is particularly needed. The magnetic sensor 1 further includes thin-film magnets 20 disposed on the substrate 10. The thin-film magnets 20 are each composed of a hard magnetic material (hard magnetic layer 103) and applies a bias magnetic field to the sensitive elements 31 of the sensitive part 30.

Details about the magnetic sensor 1 including its sectional structure will be detailed later.

The hard magnetic material refers to a so-called high coercivity material that, once being magnetized by an external magnetic field, keeps its magnetized state even after removal of the external magnetic field. The soft magnetic material refers to a so-called low coercivity material that is easily magnetizable by an external magnetic field but quickly returns to a non-magnetized or low magnetized state after removal of the external magnetic field.

In the present specification, elements constituting the magnetic sensor 1 (e.g., thin-film magnet 20) is denoted by two-digit reference numerals, and layers processed into these elements (e.g., hard magnetic layer 103) are denoted by reference numerals in the 100s. And the reference numeral for each layer processed into a corresponding element may be placed in parentheses following the reference numeral for the corresponding element. For example, the thin-film magnet 20 may be denoted like "the thin-film magnet 20 (hard magnetic layer 103)". In the figures, the reference numerals may be presented like "20(103)". This holds for other elements.

A description will be given of a planar structure of the magnetic sensor 1, with reference to FIG. 1A. By way of example, the magnetic sensor 1 has a rectangular planar shape.

As described above, the magnetic sensor 1 includes the sensitive part 30. The sensitive part 30 includes: a plurality of sensitive elements 31 each being of a long strip shape having longitudinal and transverse directions; connecting portions 32 connecting each adjacent sensitive elements 31 in series in a zigzag form; and terminal portions 33 connected with electric wires for electric current supply. In the shown example, four sensitive elements 31 are arranged such that their longitudinal directions are parallel to each other. In the magnetic sensor 1 of the present embodiment, the sensitive elements 31 are magnetic impedance effect elements.

By way of example, each sensitive element 31 has a longitudinal length of about 1 mm, a transverse width of about several hundreds of micrometers, a thickness (total thickness of the soft magnetic layers 105 and the demagnetizing field suppressing layer 106) of 0.5 µm to 5 µm. A distance between each adjacent sensitive elements 31 is 50 µm to 150 µm.

The connecting portions 32 are disposed between ends of each adjacent sensitive elements 31 to connect each adjacent sensitive elements 31 in series in a zigzag form. As the magnetic sensor 1 shown in FIG. 1A includes four sensitive elements 31 arranged in parallel to each other, there are three connecting portions 32. The number of the sensitive elements 31 is set as a function of the magnitude of the magnetic field to be sensed (measured), for example. Accordingly, in the case where there are two sensitive elements 31, there will be one connecting portion 32. In the case where there is one sensitive element 31, there will be no connecting portion 32. The width of the connecting portion 32 may be set as a function of electric current to be supplied to the sensitive part 30. By way of example, the connecting portion 32 may have the same width as that of the sensitive element 31.

The terminal portions 33 are provided to two respective ends of the sensitive elements 31 that are not connected with the connecting portions 32. Each terminal portion 33 includes a lead-out portion led out from the sensitive element 31 and pad portions to be connected with electric wires for electric current supply. The lead-out portion is provided to arrange the two pad portions in the transverse direction of the sensitive element 31. The pad portions may be arranged continuous to the sensitive element 31 without the lead-out portion. The pad portions may have a size that allows for connection of electric wires. Since there are four sensitive elements 31, the two terminal portions 33 are arranged on the left side in FIG. 1A. In the case where the sensitive elements 31 are odd in number, the two terminal portions 33 may be arranged respectively on the right and left sides.

The sensitive elements 31, the connecting portions 32, and the terminal portions 33 of the sensitive part 30 are integrally formed of the two soft magnetic layers 105 (lower soft magnetic layer 105a and upper soft magnetic layer 105b) and the demagnetizing field suppressing layer 106. As the soft magnetic layers 105 and the demagnetizing field suppressing layer 106 are conductive, electric current can be supplied from one terminal portion 33 to the other terminal portion 33.

Note that the length and width of each sensitive element 31 and the number of sensitive elements 31 arranged in parallel described above are merely exemplary, and these parameters may be modified according to factors such the value of the magnetic field to be sensed (measured) and the soft magnetic material to be used.

The magnetic sensor 1 further includes the yokes 40 facing the longitudinal ends of the sensitive elements 31. In this example, the magnetic sensor 1 includes two yokes 40a, 40b facing respective longitudinal ends of the sensitive elements 31. Hereinafter, the yokes 40a, 40b may be simply referred to as the yokes 40 unless their distinction is particularly needed. The yokes 40 induce magnetic lines of force to the longitudinal ends of the sensitive elements 31. Hence, the yokes 40 include a soft magnetic material (soft magnetic layer 105) that easily transmits magnetic lines of force. In this example, the sensitive part 30 and the yokes 40 are composed of the two soft magnetic layers 105 (lower soft magnetic layer 105a and upper soft magnetic layer 105b) and the demagnetizing field suppressing layer 106. It should be noted that the yokes 40 may be eliminated when magnetic lines of force can sufficiently pass through the sensitive elements 31 in the longitudinal direction thereof.

The magnetic sensor 1 further includes the two thin-film magnets 20 facing each other in the longitudinal direction across the sensitive part 30 and the yokes 40. In this example, the magnetic sensor 1 includes a thin-film magnet 20a spaced from and adjacent to the yoke 40a and a thin-film magnet 20b spaced from and adjacent to the yoke 40b. The thin-film magnets 20a, 20b apply a magnetic field (bias magnetic field described later) in the longitudinal direction of the sensitive elements 31. The thin-film magnets 20a, 20b are composed of a hard magnetic material (hard magnetic layers 103a, 103b). In this example, each of the thin-film magnets 20a, 20b has a rectangular planar shape. By way of example, each of the thin-film magnets 20a, 20b has a longitudinal length of about 4 mm and a transverse length of about 2 mm.

Hereinafter, the thin-film magnets 20a, 20b may be simply referred to as thin-film magnets 20 unless their distinction is particularly needed. Likewise, the hard magnetic layers 103a, 103b may be simply referred to as hard magnetic layers 103 unless their distinction is particularly needed.

From the above, the magnetic sensor 1 is several millimeters square in planar shape. It should be noted that the size of the magnetic sensor 1 is not limited to this value.

Now a detailed description will be given of a sectional structure of the magnetic sensor 1, with reference to FIG. 1B. The magnetic sensor 1 is composed of the nonmagnetic substrate 10, and the sensitive part 30 and the yokes 40, which consist of the soft magnetic layers 105 and the demagnetizing field suppressing layer 106, and the thin-film magnets 20, which consist of the hard magnetic layers 103, disposed (laminated) on the substrate 10. In other words, the sensitive part 30, the yokes 40, and the thin-film magnets 20 are provided on the same substrate 10 in the magnetic sensor 1. The magnetic sensor 1 further includes an adhesive layer 101 and a control layer 102 laminated between the substrate 10 and each thin-film magnet 20. To further illustrate, an adhesive layer 101a and a control layer 102a are laminated between the substrate 10 and the thin-film magnet 20a (hard magnetic layer 103a), and an adhesive layer 101b and a control layer 102b are laminated between the substrate 10 and the thin-film magnet 20b (hard magnetic layer 103b).

The substrate 10 is made of a nonmagnetic material. Example of the substrate 10 includes an oxide substrate such as glass and sapphire, a semiconductor substrate such as silicon, and a metal substrate such as aluminum, stainless steel, and metal plated with nickel phosphorus.

Each sensitive element 31 of the sensitive part 30 is imparted with uniaxial magnetic anisotropy in a direction intersecting the longitudinal direction, e.g., in the transverse direction (width direction) perpendicular to the longitudinal direction. It should be noted that the direction intersecting the longitudinal direction may be a direction at an angle of 45 degrees or more with respect to the longitudinal direction.

As the soft magnetic material (lower soft magnetic layer 105a and upper soft magnetic layer 105b) constituting the sensitive element 31, use may be made of an amorphous alloy that contains Co as a main component and is doped with high melting point metal such as Nb, Ta, and W (hereinafter referred to as a Co alloy constituting the sensitive element 31). Examples of the Co alloy constituting the sensitive element 31 include CoNbZr, CoFeTa, and CoWZr. Each soft magnetic material (lower soft magnetic layer 105a and upper soft magnetic layer 105b) constituting the sensitive element 31 is 0.2 μm to 2 μm thick, for example.

The demagnetizing field suppressing layer 106 constituting the sensitive element 31 is made of Ru or an Ru alloy. Here, setting a film thickness of the demagnetizing field suppressing layer 106 made of Ru or an Ru alloy in the range of 0.4 nm to 1.0 nm or in the range of 1.6 nm to 2.6 nm results in the lower soft magnetic layer 105a and the upper soft magnetic layer 105b having an antiferromagnetically coupled (AFC) structure. This reduces the demagnetization field and improves sensitivity of the sensitive elements 31.

The adhesive layer 101 increases adhesiveness of the control layer 102 to the substrate 10. As the adhesive layer 101, use may be made of an alloy containing Cr or Ni. Examples of the alloy containing Cr or Ni include CrTi, CrTa, and NiTa. The adhesive layer 101 is 5 nm to 50 nm thick, for example. It should be noted that the adhesive layer 101 may be eliminated when the control layer 102 has sufficient adhesiveness to the substrate 10. It should be noted that in the present specification, the composition ratio of the alloy containing Cr or Ni will not be presented. This holds for other alloys given below.

The control layer 102 controls the magnetic anisotropy of the thin-film magnet 20, which is composed of the hard magnetic layer 103, such that the magnetic anisotropy develops in an in-plane direction. As the control layer 102, use may be made of Cr, Mo, W, or an alloy containing at least one of these metals (hereinafter referred to as an alloy containing Cr or the like constituting the control layer 102). Examples of the alloy containing Cr or the like constituting the control layer 102 include CrTi, CrMo, CrV, and CrW. Also, the alloy containing Cr or the like constituting the control layer 102 has a body-centered cubic (bcc) structure. The control layer 102 is 10 nm to 300 nm thick, for example.

As the hard magnetic layer 103 constituting the thin-film magnet 20, use may be made of an alloy that contains Co as a main component and one or both of Cr and Pt (hereinafter referred to as a Co alloy constituting the thin-film magnet 20). Examples of the Co alloy constituting the thin-film magnet 20 include CoCrPt, CoCrTa, CoNiCr, and CoCrPtB. The Co alloy constituting the thin-film magnet 20 may also contain Fe. The hard magnetic layer 103 is 500 nm to 1500 nm thick, for example.

The alloy containing Cr or the like constituting the control layer 102 has a body-centered cubic (bcc) structure. Thus, the hard magnetic material (hard magnetic layer 103) constituting the thin-film magnet 20 preferably has a hexagonal close-packed (hcp) structure, which allows crystal growth to easily take place on the control layer 102 composed of the alloy containing Cr or the like with the bcc structure. Such crystal growth of the hard magnetic layer 103 with the hcp structure on the bcc structure can easily cause a c-axis of the hcp structure to be oriented in the in-plane direction. Consequently, the thin-film magnet 20, which is composed of the hard magnetic layer 103, can easily have the magnetic anisotropy in the in-plane direction. The hard magnetic layer 103 is a polycrystal composed of a group of differently oriented crystallites, and each crystallite has the magnetic anisotropy in the in-plane direction. This magnetic anisotropy is derived from magneto-crystalline anisotropy.

To facilitate the crystal growth of the alloy containing Cr or the like constituting the control layer 102 and the Co alloy constituting the thin-film magnet 20, the substrate 10 may be heated to 100° C. to 600° C. This heating facilitates the crystal growth of the alloy containing Cr or the like constituting the control layer 102 and thus facilitates the crystal orientation that yields an easy axis of magnetization in the plane of the hard magnetic layer 103 with the hcp structure. In other words, the heating facilitates impartation of the in-plane magnetic anisotropy to the hard magnetic layer 103.

The adhesive layers 101a, 101b, the control layers 102a, 102b, and the hard magnetic layers 103 (thin-film magnets 20a, 20b) are processed to have a rectangular planar shape (see FIG. 1A).

The thin-film magnets 20a, 20b are disposed such that different magnetic poles face each other in the longitudinal direction via the yokes 40 and the sensitive part 30. In this example, the north pole of the thin-film magnet 20a and the south pole of the thin-film magnet 20b face each other in the longitudinal direction via the yokes 40 and the sensitive part 30. To further illustrate, a line connecting the north pole of the thin-film magnet 20a and the south pole of the thin-film magnet 20b is oriented in the longitudinal direction of the sensitive element 31 of the sensitive part 30. The phrase "oriented in the longitudinal direction" means that the line connecting the north pole and the south pole is angled from 0 to 45 degrees with respect to the longitudinal direction. A smaller angle between the line connecting the north and south poles and the longitudinal direction is preferable.

In the magnetic sensor 1, magnetic lines of force emanating from the north pole of the thin-film magnet 20a pass through the sensitive elements 31 via the yoke 40a and reach the south pole of the thin-film magnet 20b via the yoke 40b. In other words, the thin-film magnets 20a, 20b apply the magnetic field in the longitudinal direction of the sensitive elements 31. This magnetic field is called a bias magnetic field.

The north and south poles of the thin-film magnets 20a, 20b are hereinafter collectively referred to as "both magnetic poles", and each of the north and south poles is hereinafter referred to as a "magnetic pole" unless their distinction is particularly needed. While the description herein is made using the case where the right side of each of the thin-film magnets 20a, 20b is the north pole and the left side thereof is the south pole in FIGS. 1A and 1B, the north and south poles may be interchanged.

As shown in FIG. 1A, when viewed from the top side of the substrate 10, each of the yokes 40 (yokes 40a, 40b) has a shape that is tapered as it approaches the sensitive part 30. This shape makes it possible to gather the magnetic lines of force into the sensitive part 30. In other words, this shape helps increase the sensitivity by enhancing the magnetic field at the sensitive part 30. It should be noted that the yokes 40 (yokes 40a, 40b) are not necessarily tapered on the portions thereof facing the sensitive part 30.

A distance between each of the yokes 40 (yokes 40a, 40b) and the sensitive part 30 may be 1 μm to 100 μm, for example.

Also, a distance between each of the yokes 40 (yokes 40a, 40b) and the corresponding one of the thin-film magnets 20 (thin-film magnets 20a, 20b) may be 1 μm to 100 μm, for example. Alternatively, each of the yokes 40 (yokes 40a, 40b) and the corresponding one of the thin-film magnets 20 (thin-film magnets 20a, 20b) may be in contact with each other.

(Functions of the Magnetic Sensor 1)

Figure 2:
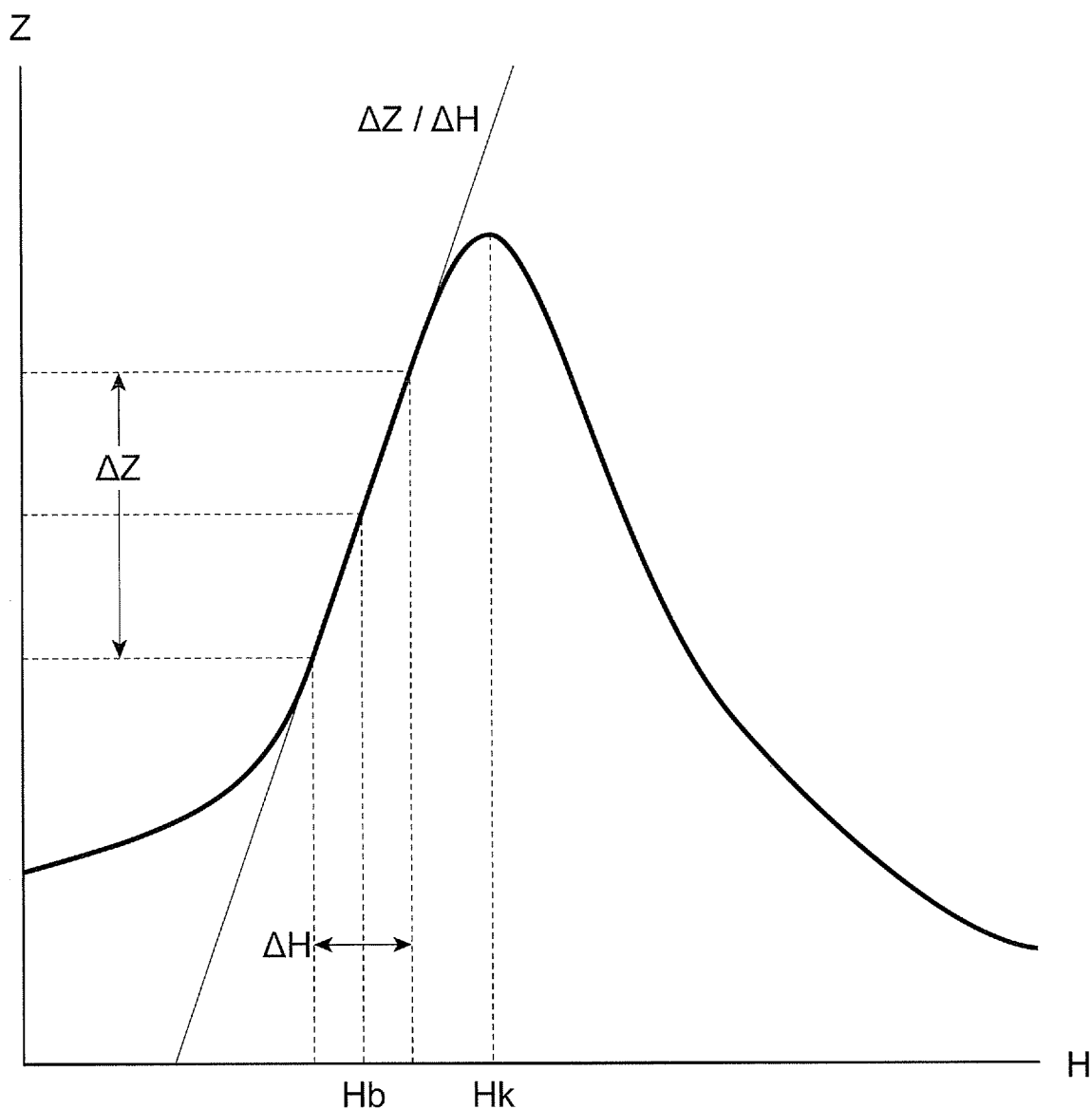
FIG. 2 illustrates a relationship between a magnetic field applied in a longitudinal direction of sensitive elements of a sensitive part of the magnetic sensor and impedance of the sensitive part.

Now a description will be given of functions of the magnetic sensor 1 of the present embodiment. FIG. 2 illustrates a relationship between the magnetic field applied in the longitudinal direction of the sensitive elements 31 of the sensitive part 30 of the magnetic sensor 1 and impedance of the sensitive part 30. In FIG. 2, the horizontal axis represents the magnetic field H, and the vertical axis represents the impedance Z. The impedance Z of the sensitive part 30 is measured by applying high-frequency electric current between the two terminal portions 33.

As shown in FIG. 2, the impedance Z of the sensitive part 30 increases with increase in the magnetic field H applied in the longitudinal direction of the sensitive elements 31. However, by use of a portion where an amount of change ΔZ of the impedance Z is steep as a function of an amount of change ΔH of the magnetic field H (i.e., a portion where ΔZ/ΔH is large) within the region where the applied magnetic field H is smaller than the anisotropic magnetic field Hk of the sensitive elements 31, a slight change of the magnetic field H can be extracted as the amount of change ΔZ of the impedance Z. In FIG. 2, the center of the portion of the magnetic field H where the ΔZ/ΔH is large is denoted as a magnetic field Hb. That is, the amount of change of the magnetic field H (ΔH) near the magnetic field Hb (in the region shown by the arrows in FIG. 2) can be measured with high accuracy. The magnetic field Hb may also be called a bias magnetic field.

Figure 6A:
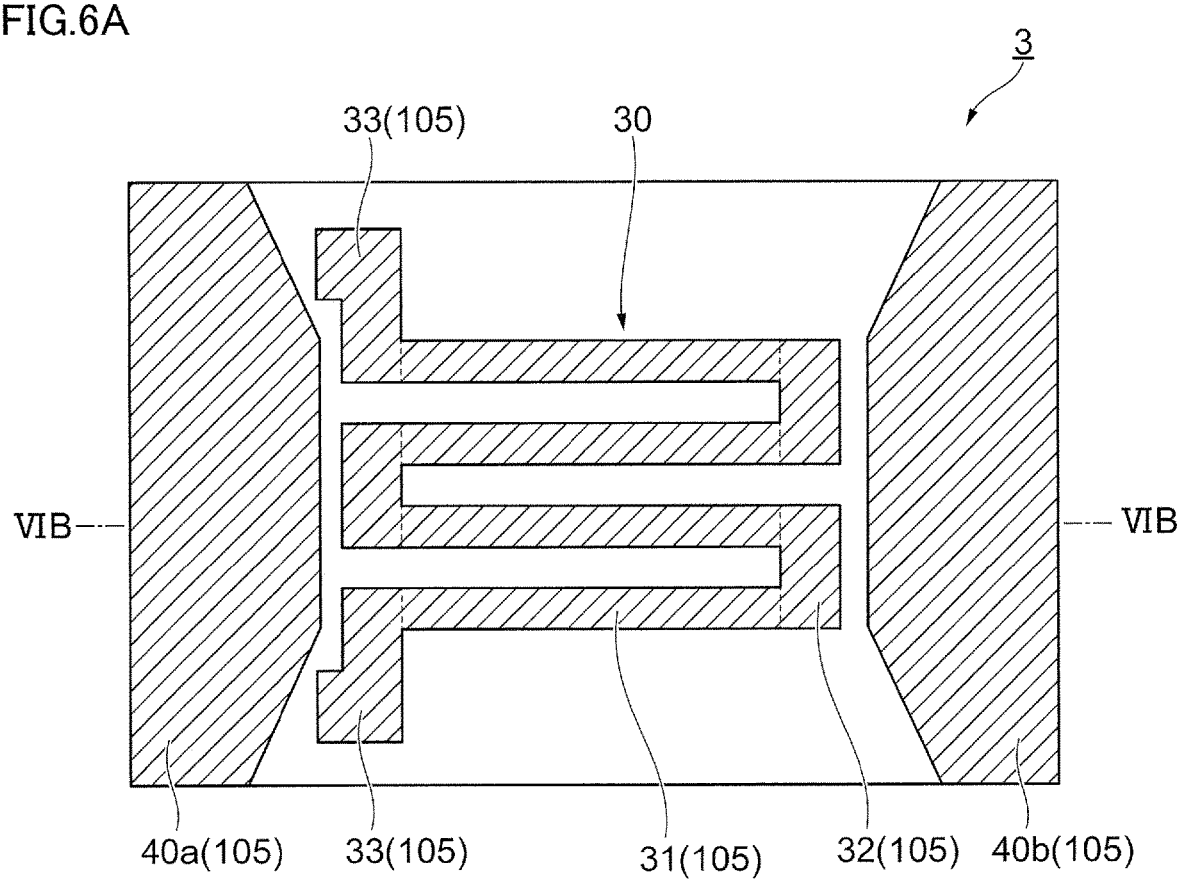
FIGS. 6A and 6B illustrate an example of a conventional magnetic sensor.
Figure 6B:
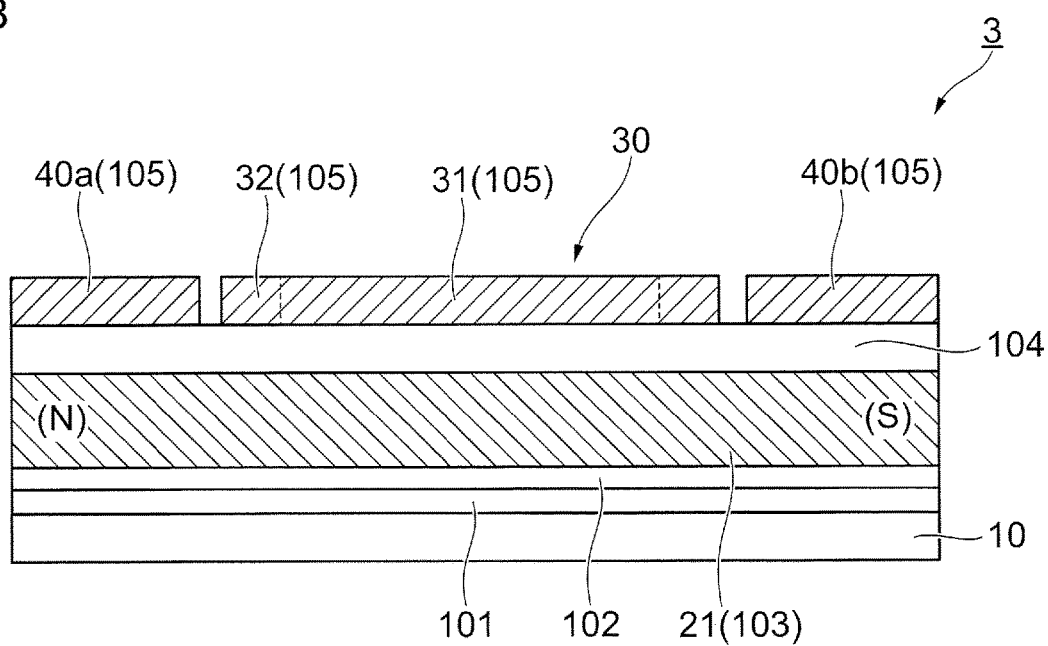

By the way, a magnetic sensor including a sensitive element as a magnetic impedance effect element and a thin-film magnet for applying a bias magnetic field to the sensitive element may have a structure in which the thin-film magnet and a sensitive part are laminated on a substrate with an insulating layer interposed between the thin-film magnet and the sensitive part. FIGS. 6A and 6B illustrate an example of a conventional magnetic sensor 3; FIG. 6A is a plan view of the magnetic sensor 3, and FIG. 6B is a sectional view taken along the line VIB-VIB in FIG. 6A. Similar components to those of the magnetic sensor 1 shown in FIGS. 1A and 1B are denoted by the same reference numerals, and detailed description thereof has been omitted.

The magnetic sensor 3 shown in FIGS. 6A and 6B includes the adhesive layer 101, the control layer 102, a thin-film magnet 21, and an insulating layer 104 laminated in this order on the substrate 10, and the sensitive part 30 and the yokes 40 are formed on the insulating layer 104. In other words, in the magnetic sensor 3, the sensitive part 30 (sensitive elements 31) and the thin-film magnet 21 face each other across the insulating layer 104.

When high-frequency electric current is supplied to the sensitive part 30 of the above configured magnetic sensor 3, the magnetic sensor 3 may act as a capacitor due to polarization of the insulating layer 104 interposed between the conductive thin-film magnet 21 and sensitive part 30.

Thus, as a result of the high-frequency electric current supplied to the sensitive part 30 being used for the capacitor, the magnetic sensor 3 may have a smaller amount of change ΔZ of the impedance Z as a function of the amount of change ΔH of the magnetic field H.

In contrast, the magnetic sensor 1 of the present embodiment have the thin-film magnets 20 disposed on the substrate 10 similarly to the sensitive part 30 as described above, as opposed to disposing the thin-film magnets 20 between the sensitive part 30 and the substrate 10. In other words, the magnetic sensor 1 of the present embodiment have the thin-film magnets 20 and the sensitive part 30 (sensitive elements 31) laminated on the same substrate 10. This allows for effective use of high-frequency electric current when it is applied to the sensitive part 30, avoiding a decrease in the amount of change ΔZ of the impedance Z as a function of the amount of change ΔH of the magnetic field H.

Additionally, as the magnetic sensor 1 eliminates the need for an insulating layer for insulation between the thin-film magnets 20 and the sensitive part 30, the magnetic sensor 1 can be simple in structure.

It should be noted that the phrase "laminated on the substrate 10" not only means a structure in which a relevant layer is directly laminated on the substrate 10 but also a structure in which a relevant layer is laminated on the substrate 10 through one or more intervening layers. For example, the phrase "the thin-film magnet 20 is laminated on the substrate 10" not only means a structure in which the thin-film magnet 20 is directly laminated on the substrate 10 but also a structure in which the thin-film magnet 20 is laminated on the substrate 10 through the adhesive layer 101 and the control layer 102 as shown in FIG. 1B.

(Method for Manufacturing the Magnetic Sensor 1)

Now a description will be given of an exemplary method for manufacturing the magnetic sensor 1.

FIGS. 3A to 3C and 4A to 4D illustrate an exemplary method for manufacturing the magnetic sensor 1. FIGS. 3A to 3C and 4A to 4D depict steps of the method for manufacturing the magnetic sensor 1. It should be noted that the steps shown in FIGS. 3A to 3C and 4A to 4D are representative in nature and may include other steps. The steps proceed sequentially from FIG. 3A through FIG. 4D. FIGS. 3A to 3C and 4A to 4D correspond to the sectional view taken along the line IB-IB in FIG. 1A.

As described above, the substrate 10 is a substrate made of a nonmagnetic material, e.g., an oxide substrate such as glass and sapphire, a semiconductor substrate such as silicon, and a metal substrate such as aluminum, stainless steel, and metal plated with nickel phosphorus. The substrate 10 may be formed with linear grooves or linear protrusions and recesses with a curvature radius Ra of e.g., 0.1 nm to 100 nm by means of a polishing machine or the like. The direction of these linear grooves or linear protrusions and recesses may be aligned with the direction connecting the north and south poles of the thin-film magnets 20 composed of the hard magnetic layer 103. This facilitates the crystal growth of the hard magnetic layer 103 in the direction of the grooves. This in turn helps to cause the easy axis of magnetization of the thin-film magnets 20, each being composed of the hard magnetic layer 103, to be oriented in the direction of the grooves (direction connecting the north and south poles of the thin-film magnets 20). In other words, the thin-film magnets 20 can be magnetized easier.

By way of example, the substrate 10 discussed herein is assumed to be glass that is about 95 mm in diameter and about 0.5 mm thick. In the case where the magnetic sensor 1 is several millimeters square in planar shape, multiple magnetic sensors 1 are manufactured in batch on the substrate 10 and then divided (cut) into individual magnetic sensors 1. While FIGS. 3A to 3C and 4A to 4D focus on one magnetic sensor 1 depicted at the center of the figures, the figures also depict portions of right and left adjacent magnetic sensors 1. A boundary between two adjacent magnetic sensors 1 is shown by a dash-dotted line in the figures.

Figure 3A:
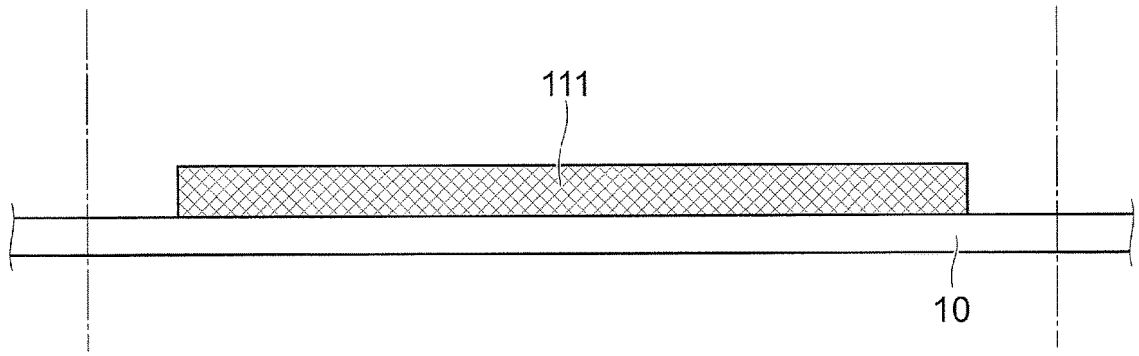
FIGS. 3A to 3C illustrate an exemplary method for manufacturing the magnetic sensor.

As shown in FIG. 3A, after cleaning of the substrate 10, a photoresist pattern (resist pattern) 111 is formed on one side (hereinafter referred to as a "top side") of the substrate 10 by any known photolithography technique. The resist pattern 111 includes openings at positions where the thin-film magnets 20 (thin-film magnets 20a, 20b) are to be formed.

Figure 3B:
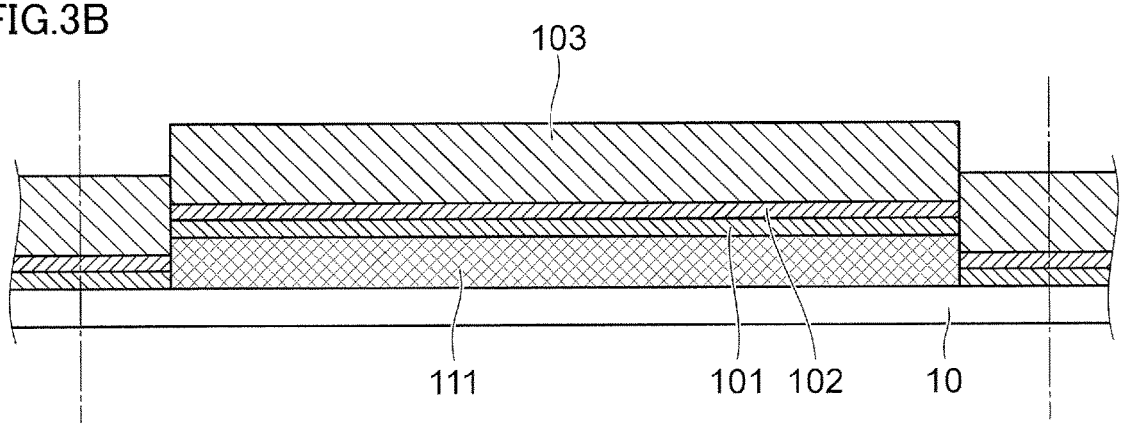

As shown in FIG. 3B, the adhesive layer 101, the control layer 102, and the hard magnetic layer 103 are deposited (stacked) in this order.

Specifically, the adhesive layer 101 composed of the alloy containing Cr or Ni, the control layer 102 composed of the alloy containing Cr or the like, and the hard magnetic layer 103 composed of the Co alloy constituting the thin-film magnet 20 are successively deposited (stacked) in this order. This deposition may be done by a sputtering method or the like. The substrate 10 is moved to successively face multiple targets made of respective materials, whereby the adhesive layer 101, the control layer 102, and the hard magnetic layer 103 are laminated in this order on the substrate 10. As described above, the substrate 10 may be heated to e.g., 100° C. to 600° C. during formation of the control layer 102 and the hard magnetic layer 103 to facilitate the crystal growth.

The substrate 10 may or may not be heated during deposition of the adhesive layer 101. The substrate 10 may be heated prior to deposition of the adhesive layer 101 to remove moisture absorbed on the top side of the substrate 10.

Figure 3C:
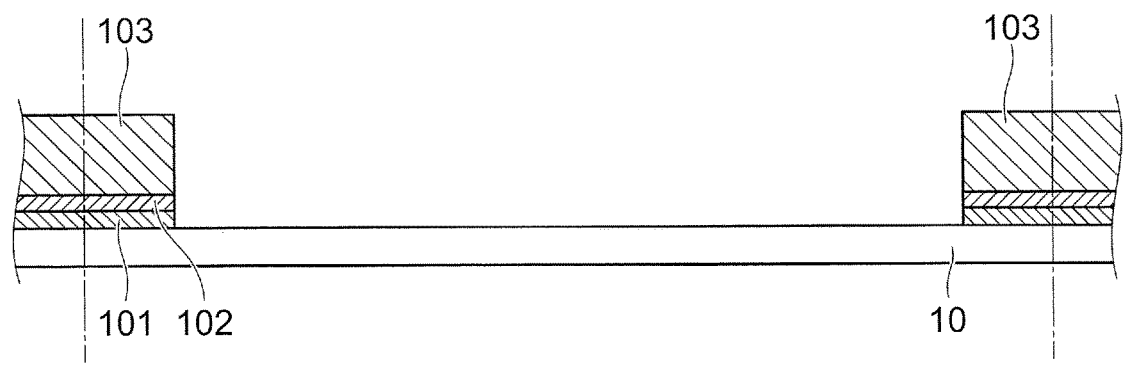

As shown in FIG. 3C, the resist pattern 111 is removed, and also the adhesive layer 101, the control layer 102, and the hard magnetic layer 103 on the resist pattern 111 are removed (lifted off).

Figure 4A:
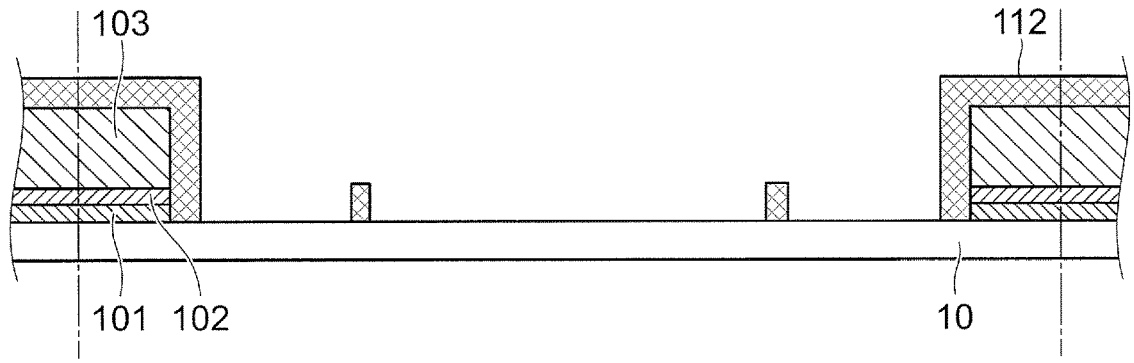
FIGS. 4A to 4D illustrate the exemplary method for manufacturing the magnetic sensor.

As shown in FIG. 4A, a resist pattern 112 is formed that includes openings at positions where the sensitive part 30 and the yokes 40 (yokes 40a, 40b) are to be formed.

Figure 4B:
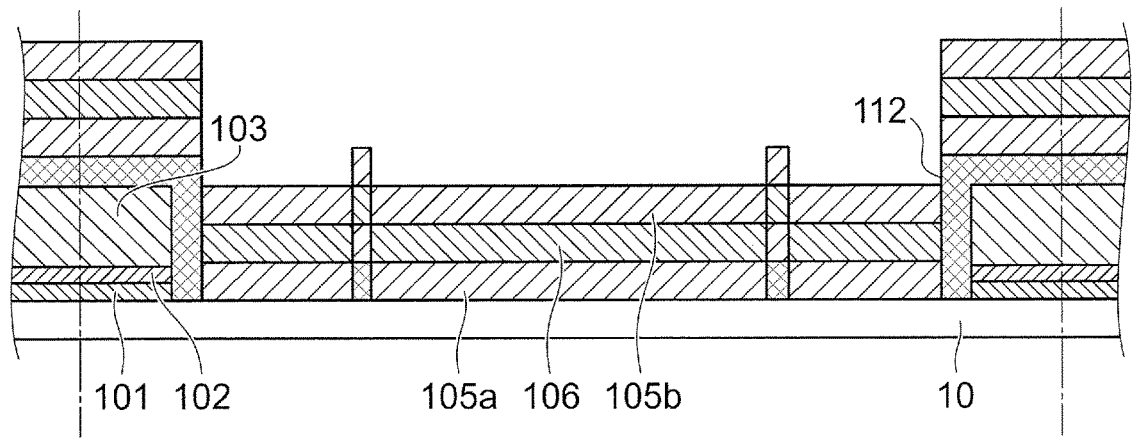

As shown in FIG. 4B, the lower soft magnetic layer 105a composed of the Co alloy constituting the sensitive element 31, the demagnetizing field suppressing layer 106 composed of Ru or the Ru alloy, and the upper soft magnetic layer 105b composed of the Co alloy constituting the sensitive element 31 are deposited (stacked) in this order. The deposition of the soft magnetic layers 105 (lower soft magnetic layer 105a and upper soft magnetic layer 105b) and the demagnetizing field suppressing layer 106 may be done by a sputtering method, for example.

Figure 4C:
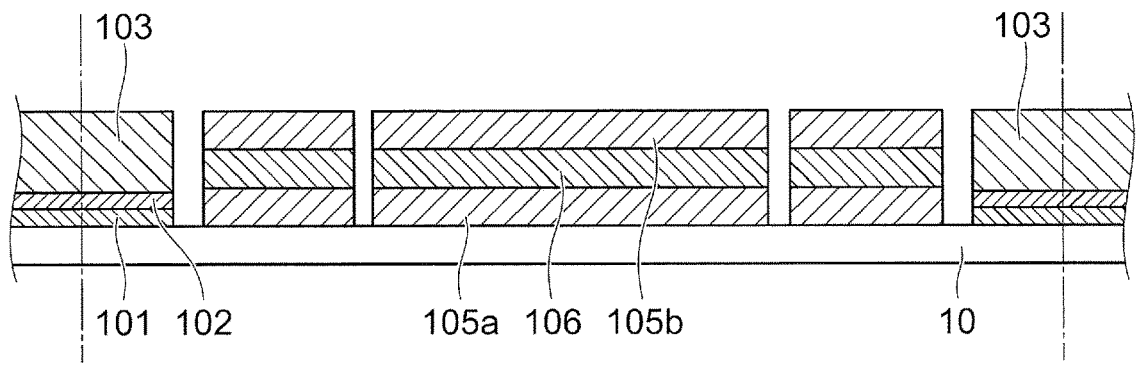

As shown in FIG. 4C, the resist pattern 112 is removed, and also the soft magnetic layers 105 and the demagnetizing field suppressing layer 106 on the resist pattern 112 are removed (lifted off). As a result, the sensitive part 30 and the yokes 40 (yokes 40a, 40b) composed of the soft magnetic layers 105 and the demagnetizing field suppressing layer 106 are formed. In other words, the sensitive part 30 and the yokes 40 are simultaneously formed by deposition of the soft magnetic layers 105 and the demagnetizing field suppressing layer 106.

Thereafter, the soft magnetic layers 105 are imparted with uniaxial magnetic anisotropy in the width direction of the sensitive elements 31 of the sensitive part 30. This impartation of the uniaxial magnetic anisotropy to the soft magnetic layers 105 can be done by, for example, heat treatment (heat treatment in a rotating magnetic field) at 400° C. in a rotating magnetic field of 3 kG (0.3 T) and subsequent heat treatment (heat treatment in a static magnetic field) at 400° C. in a static magnetic field of 3 kG (0.3 T). At this time, similar uniaxial magnetic anisotropy is imparted to the soft magnetic layers 105 constituting the yokes 40. However, the yokes 40 are not necessarily imparted with the uniaxial magnetic anisotropy because the yokes 40 are only required to serve as a magnetic circuit.

Then, the hard magnetic layer 103 constituting each thin-film magnet 20 is magnetized. This magnetization of the hard magnetic layer 103 can be done by applying a magnetic field larger than coercive force of the hard magnetic layer 103 in a static magnetic field or a pulsed magnetic field until the magnetization of the hard magnetic layer 103 is saturated. Thus, the magnetic pole of each thin-film magnet 20 (north pole of the thin-film magnet 20a and south pole of the thin-film magnet 20b) is formed on a lateral side of the corresponding hard magnetic layer 103 facing the sensitive part 30 with a gap in between. That is, the magnetized hard magnetic layer 103 becomes the thin-film magnet 20.

The step of depositing the hard magnetic layer 103 constituting the thin-film magnet 20 and the step of magnetizing the hard magnetic layer 103 described above are those for forming the thin-film magnet 20 whose magnetic anisotropy is controlled in the in-plane direction, and thus these steps may be hereinafter collectively referred to as thin-film magnet forming steps.

Figure 4D:
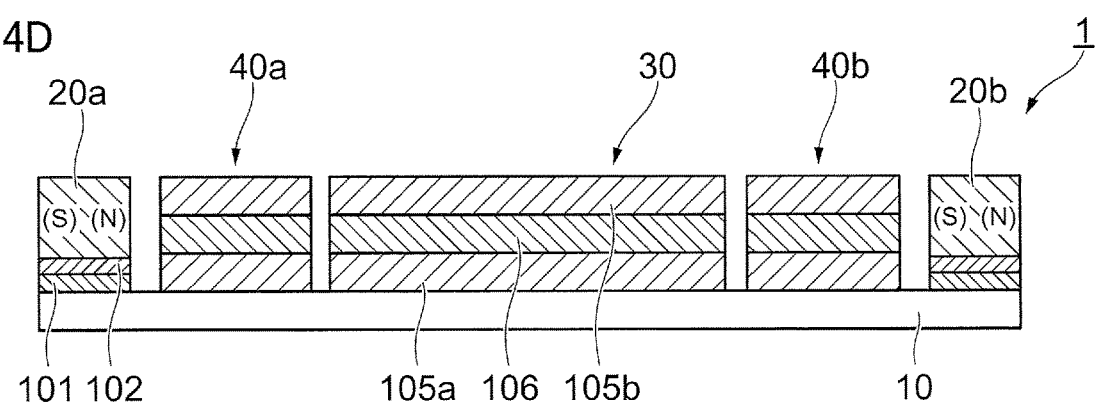

Subsequently, as shown in FIG. 4D, multiple magnetic sensors 1 formed on the substrate 10 are divided (cut) into individual magnetic sensors 1. In other words, the substrate 10, the adhesive layer 101, the control layer 102, and the hard magnetic layer 103 are cut such that each magnetic sensor 1 has a rectangular planar shape as shown in the plan view of FIG. 1A. This division (cutting) can be done by a dicing method, a laser cutting method, or the like.

It should be noted that an etching step of removing the adhesive layer 101, the control layer 102, and the hard magnetic layer 103 between adjacent magnetic sensors 1 on the substrate 10 so as to shape each magnetic sensor 1 into a rectangular planar shape (planar shape of the magnetic sensor 1 shown in FIG. 1A) may take place after the step of laminating the adhesive layer 101, the control layer 102, and the hard magnetic layer 103 shown in FIG. 3B and before the step of dividing the multiple magnetic sensors 1 into individual magnetic sensors 1 shown in FIG. 4D. As such, the exposed substrate 10 may be divided (cut).

As compared to this method, the manufacturing method shown in FIGS. 3A to 3C and 4A to 4D requires simplified steps.

Also, the steps of laminating the soft magnetic layers 105 and the demagnetizing field suppressing layer 106 to form the sensitive part 30 and the yokes 40 shown in FIGS. 4A to 4C may precede the step of laminating the adhesive layer 101, the control layer 102, and the hard magnetic layer 103 shown in FIG. 3B.

The magnetic sensor 1 is thus manufactured. It should be noted that the impartation of the uniaxial magnetic anisotropy to the soft magnetic layers 105 and/or magnetization of the thin-film magnets 20 may be performed for each magnetic sensor 1 or multiple magnetic sensors 1 after the step of dividing the multiple magnetic sensors 1 into individual magnetic sensors 1 shown in FIG. 4D.

Without the control layer 102, it would be necessary to impart the magnetic anisotropy in the plane of the hard magnetic layer 103 by heating the hard magnetic layer 103 to 800° C. or more to bring about crystal growth after deposition thereof. In contrast, providing the control layer 102, as in the magnetic sensor 1 of the present embodiment, eliminates the need for bringing about such crystal growth under high temperature of 800° C. or more because the control layer 102 can facilitate the crystal growth.

The impartation of the uniaxial magnetic anisotropy to the sensitive elements 31 of the sensitive part 30 may be done by a magnetron sputtering method during stacking of the soft magnetic layers 105 composed of the Co alloy constituting the sensitive element 31, instead of the aforementioned heat treatment in a rotating magnetic field and heat treatment in a static magnetic field. The magnetron sputtering method forms a magnetic field using magnets and confines (concentrates) electrons generated by discharge to a surface of a target. The method thus increases the probability of collisions of the electrons with gas and facilitates ionization of the gas, thereby increasing film stacking speed (film deposition speed). This magnetic field formed by the magnets used in the magnetron sputtering method imparts the uniaxial magnetic anisotropy to the soft magnetic layers 105 at the same time as the stacking thereof. As such, the magnetron sputtering method allows the step of imparting the uniaxial magnetic anisotropy by the heat treatment in a rotating magnetic field and the heat treatment in a static magnetic field to be omitted.

Now a description will be given of a modification of the magnetic sensor 1.

(Magnetic Sensor 2)

Figure 5A:
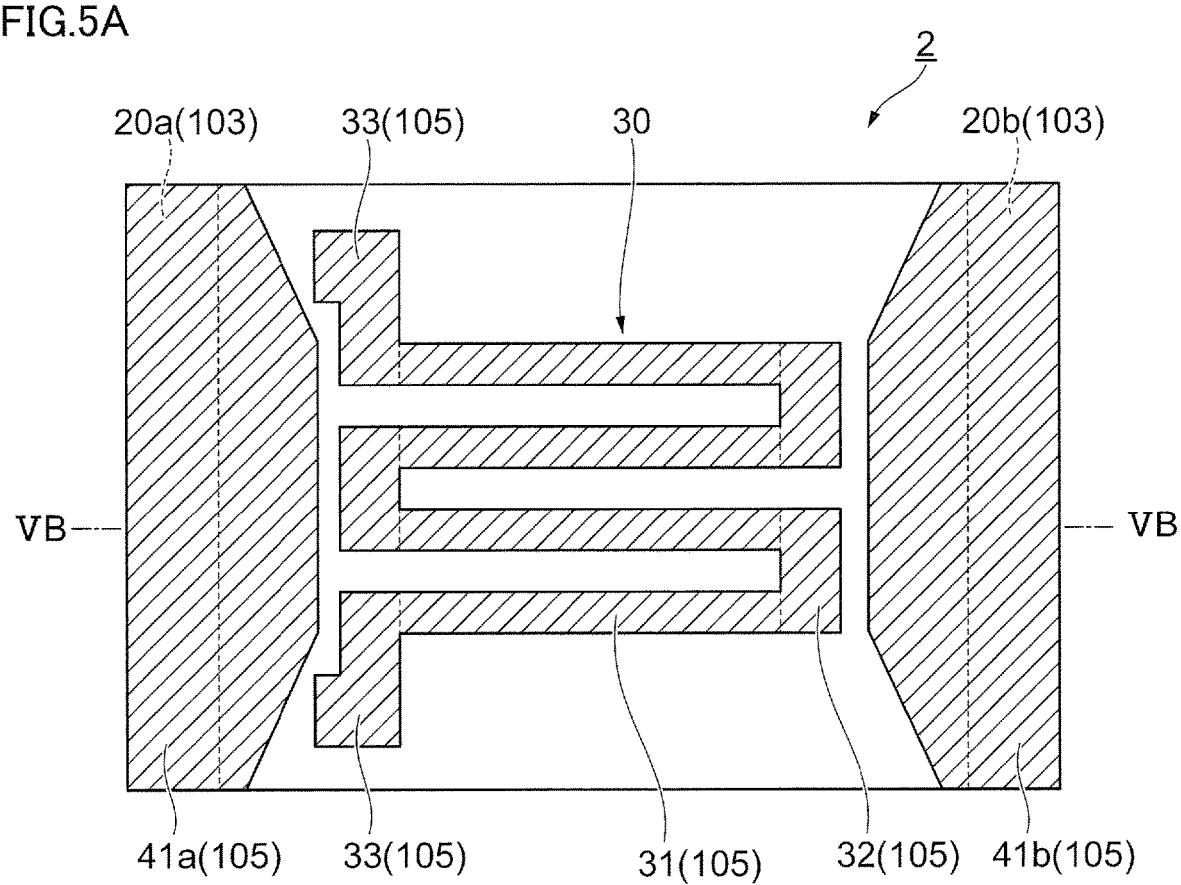
FIGS. 5A and 5B illustrate an example of a modified magnetic sensor.
Figure 5B:
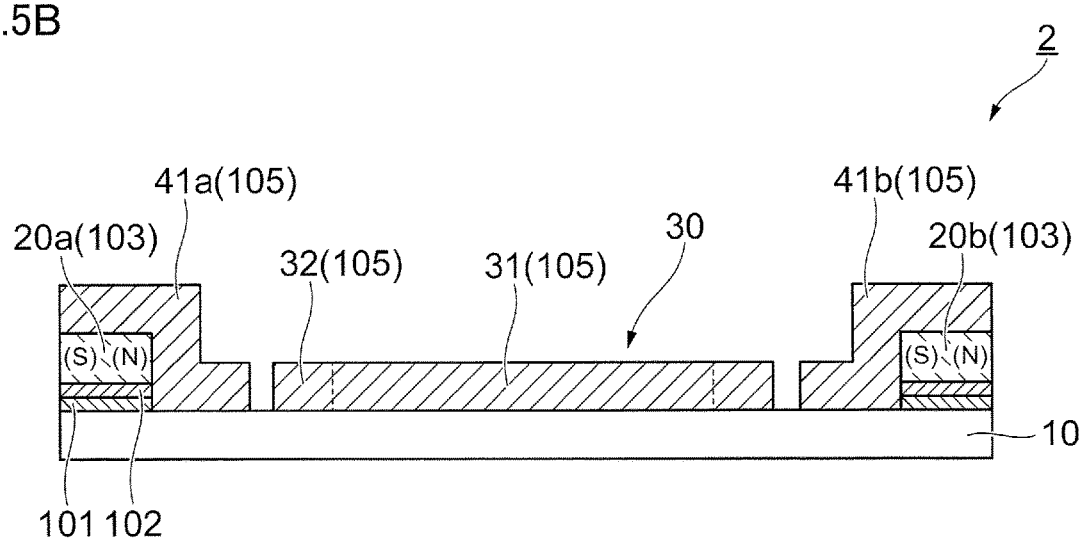

FIGS. 5A and 5B illustrate an example of a modified magnetic sensor 2; FIG. 5A is a plan view, and FIG. 5B is a sectional view taken along a line VB-VB in FIG. 5A. Similar components to those of the magnetic sensor 1 shown in FIGS. 1A and 1B are denoted by the same reference numerals, and detailed description thereof has been omitted.

In the magnetic sensor 1 shown in FIGS. 1A and 1B, the sensitive part 30 and the yokes 40 are composed of the two soft magnetic layers 105 (lower soft magnetic layer 105a and upper soft magnetic layer 105b) disposed with the demagnetizing field suppressing layer 106 in between. Also, in the magnetic sensor 1 shown in FIGS. 1A and 1B, each of the yokes 40 (yokes 40a, 40b) is disposed between the sensitive part 30 and the corresponding one of the thin-film magnets 20 (thin-film magnets 20a, 20b) on the substrate 10.

In contrast, in the magnetic sensor 2 as a modification of the magnetic sensor 1, the sensitive part 30 and yokes 41 are each composed of a single soft magnetic layer 105, as shown in FIGS. 5A and 5B.

Additionally, in the magnetic sensor 2, each of the yokes 41 (yokes 41a, 41b) is formed continuously over an area from a position facing a longitudinal end of the sensitive element 31 to a top side of the corresponding one of the thin-film magnets 20 (thin-film magnets 20a, 20b), as shown in FIGS. 5A and 5B. To further illustrate, in the magnetic sensor 2, each of the yokes 41 (yokes 41a, 41b) is disposed such that it contacts a lateral side of the corresponding one of the thin-film magnets 20 (thin-film magnets 20a, 20b) facing the sensitive element 31 and contacts the top side thereof.

Due to the yokes 41 (yokes 41a, 41b) of the magnetic sensor 2 having the shape as shown in FIGS. 5A and 5B, magnetic lines of force emanating from the north pole of the thin-film magnet 20a are induced to the sensitive elements 31 via the yoke 41a. Also, after emanating from the north pole of the thin-film magnet 20a and passing through the sensitive elements 31, the magnetic lines of force reach the south pole of the thin-film magnet 20b via the yoke 41b.

To manufacture the magnetic sensor 2, for example, the step of forming the resist pattern 112 in the above method for manufacturing the magnetic sensor 1, as shown in FIG. 4A, is modified such that the resist pattern 112 is shaped to include openings at positions where the sensitive part 30 and the yokes 41 (yokes 41a, 41b) are to be formed.

Also, the step of depositing the lower soft magnetic layer 105a, the upper soft magnetic layer 105b, and the demagnetizing field suppressing layer 106 shown in FIG. 4B is replaced with a step of depositing a single soft magnetic layer 105. This results in the single soft magnetic layer 105 being deposited on the substrate 10 and on the hard magnetic layer 103 at positions corresponding to the openings in the resist pattern 112.

Additionally, the above step of dividing multiple magnetic sensors into individual magnetic sensors shown in FIG. 4D is modified such that the soft magnetic layer 105 deposited on the hard magnetic layer 103 is also divided (cut) in addition to the substrate 10, the adhesive layer 101, the control layer 102, and the hard magnetic layer 103.

The above steps result in the manufacture of the magnetic sensor 2 shown in FIGS. 5A and 5B.

It should be noted that an etching step of removing the adhesive layer 101, the control layer 102, the hard magnetic layer 103, and the soft magnetic layer 105 between adjacent magnetic sensors 2 on the substrate 10 so as to shape each magnetic sensor 2 into a rectangular planar shape (planar shape of the magnetic sensor 2 shown in FIG. 5A) may take place after the step of laminating the adhesive layer 101, the control layer 102, the hard magnetic layer 103, and the soft magnetic layer 105 and before the step of dividing the multiple magnetic sensors 2 into individual magnetic sensors 2. As such, the exposed substrate 10 may be divided (cut).

The magnetic sensors 2 may be manufactured by other manufacturing steps.

While the exemplary embodiment of the present invention has been described above, the present invention is not limited to the above exemplary embodiment. Various modifications and combinations of embodiments may be made without departing from the spirit of the present invention.

REFERENCE SIGNS LIST 1, 2, 3 Magnetic sensor
10 Substrate
20 Thin-film magnet
30 Sensitive part
31 Sensitive element
32 Connecting portion
33 Terminal portion
40, 40a, 40b, 41, 41a, 41b Yoke
101 Adhesive layer
102 Control layer
103 Hard magnetic layer
105 Soft magnetic layer
105a Lower soft magnetic layer
105b Upper soft magnetic layer
106 Demagnetizing field suppressing layer
111, 112 Resist pattern
H Magnetic field
Z Impedance

The invention claimed is:

1. A magnetic sensor comprising:
    a nonmagnetic substrate;
    a sensitive element laminated on the nonmagnetic substrate, the sensitive element being made of a soft magnetic material, the sensitive element having a longitudinal direction and a transverse direction and having uniaxial magnetic anisotropy in a direction intersecting the longitudinal direction, the sensitive element being configured to sense a magnetic field by a magnetic impedance effect;
    a pair of thin-film magnets laminated on the nonmagnetic substrate and disposed to face each other in the longitudinal direction across the sensitive element, the pair of thin-film magnets being configured to apply a magnetic field in the longitudinal direction of the sensitive element; and
    a control layer configured to control a magnetic anisotropy of the thin-film magnets such that the magnetic anisotropy develops in an in-plane direction.

2. The magnetic sensor according to claim 1, further comprising a pair of yokes laminated on the nonmagnetic substrate, each of the pair of yokes being disposed between the sensitive element and a corresponding one of the pair of thin-film magnets, the pair of yokes being configured to induce magnetic flux generated by the pair of thin-film magnets such that the magnetic flux passes through the sensitive element in the longitudinal direction.

3. The magnetic sensor according to claim 2, wherein each of the pair of yokes is in contact with a magnetic pole of the corresponding one of the pair of thin-film magnets, the magnetic pole facing the sensitive element in the longitudinal direction thereof.

4. The magnetic sensor according to claim 3, wherein each of the pair of yokes is disposed continuously over an area from a position between the sensitive element and the corresponding one of the pair of thin-film magnets to a top side of the corresponding one of the pair of thin-film magnets.

5. The magnetic sensor according to claim 1, wherein the sensitive element is composed of a plurality of soft magnetic layers antiferromagnetically coupled to each other across a demagnetizing field suppressing layer composed of Ru or an Ru alloy.

6. The magnetic sensor according to claim 1, wherein the control layer is arranged between the nonmagnetic substrate and the thin-film magnets.

7. A method for manufacturing a magnetic sensor, the method comprising:
    forming, on a nonmagnetic substrate, a pair of thin-film magnets whose magnetic anisotropy is controlled in an in-plane direction thereof, the pair of thin-film magnets being disposed such that different magnetic poles face each other with a space in between;
    forming a sensitive part including a sensitive element on the nonmagnetic substrate, the sensitive element having uniaxial magnetic anisotropy in a direction intersecting a direction in which magnetic flux generated by the pair of thin-film magnets passes, the sensitive element being configured to sense a magnetic field by a magnetic impedance effect; and
    forming, between the nonmagnetic substrate and the thin-film magnets, a control layer configured to control the magnetic anisotropy of the thin-film magnets such that the magnetic anisotropy develops in the in-plane direction.

* * * * *